(12) United States Patent
Higashi et al.

(10) Patent No.: US 8,043,668 B2
(45) Date of Patent: Oct. 25, 2011

(54) METHOD FOR PRODUCTION OF AN ETHYLENE/TETRAFLUORIDEETHYLENE COPOLYMER MOLDED PRODUCT

(75) Inventors: Seiji Higashi, Chiyoda-ku (JP); Chikaya Tamitsuji, Chiyoda-ku (JP)

(73) Assignee: Asahi Glass Company, Limited, Tokyo (JP)

( * ) Notice: Subject to any disclaimer, the term of this patent is extended or adjusted under 35 U.S.C. 154(b) by 182 days.

(21) Appl. No.: 12/431,906

(22) Filed: Apr. 29, 2009

(65) Prior Publication Data

US 2009/0214801 A1    Aug. 27, 2009

Related U.S. Application Data

(63) Continuation of application No. PCT/JP07/66809, filed on Aug. 29, 2007.

(30) Foreign Application Priority Data

Nov. 2, 2006 (JP) .................................. 2006-298824

(51) Int. Cl.
*H05H 1/24* (2006.01)

(52) U.S. Cl. .................... 427/578; 427/579; 427/255.37

(58) Field of Classification Search .................. 427/569, 427/574, 578, 579, 255.37
See application file for complete search history.

(56) References Cited

U.S. PATENT DOCUMENTS

| | | | | |
|---|---|---|---|---|
| 3,893,971 A * | 7/1975 | Ukihashi et al. | ............... | 524/430 |
| 4,123,602 A * | 10/1978 | Ukihashi et al. | ............... | 522/187 |
| 4,513,129 A * | 4/1985 | Nakagawa et al. | ............ | 526/249 |
| 5,661,093 A * | 8/1997 | Ravi et al. | ...................... | 438/763 |
| 6,057,242 A * | 5/2000 | Kishimoto | .................... | 438/692 |
| 6,124,386 A * | 9/2000 | Yokota et al. | .................. | 524/154 |
| 6,211,112 B1 * | 4/2001 | Ishibashi | ....................... | 502/159 |
| 6,821,571 B2 * | 11/2004 | Huang | ........................... | 427/535 |
| 7,037,855 B2 * | 5/2006 | Tsuji et al. | .................... | 438/758 |
| 7,109,132 B2 * | 9/2006 | Won et al. | ..................... | 438/788 |
| 2007/0111543 A1 * | 5/2007 | Woo et al. | ..................... | 438/783 |

FOREIGN PATENT DOCUMENTS

| | | |
|---|---|---|
| JP | 08-085186 | 4/1996 |
| JP | 11-58629 | 3/1999 |
| JP | 2001-205729 | 7/2001 |
| JP | 2003-276111 | 9/2003 |
| JP | 2005-256061 | 9/2005 |
| JP | 2006-152340 | 6/2006 |
| WO | 2006/059697 | 6/2006 |

\* cited by examiner

*Primary Examiner* — Bret Chen
(74) *Attorney, Agent, or Firm* — Oblon, Spivak, McClelland, Maier & Neustadt, L.L.P.

(57) ABSTRACT

Provided is a method for depositing a fluorine-doped silicon oxide film on the surface of a substrate made of a material comprising at least 50 mass % of an ethylene/tetrafluoroethylene copolymer. This method comprises flowing a mixed gas into between electrodes, exposing the mixed gas to electric power applied between the electrodes so that the electrical power density between the electrodes becomes from 0.5 to 1.1 W/cm$^3$ to cause discharge, and forming plasma of the mixed gas and depositing the fluorine-doped silicon oxide film on the surface of the substrate. In this method, the mixed gas for forming the fluorine-doped silicon oxide film comprises silicon tetrafluoride, oxygen and a hydrocarbon, the atomic ratio of oxygen atoms to carbon atoms (O/C) is from 1 to 10, and the atomic ratio of oxygen atoms to silicon atoms (O/Si) is from 1.7 to 25 in the mixed gas.

14 Claims, 1 Drawing Sheet

METHOD FOR PRODUCTION OF AN ETHYLENE/TETRAFLUORIDEETHYLENE COPOLYMER MOLDED PRODUCT

TECHNICAL FIELD

The present invention relates to an ethylene/tetrafluoroethylene copolymer molded product and a method for its production

BACKGROUND ART

An ethylene/tetrafluoroethylene copolymer (hereinafter referred to as ETFE copolymer) is a polymer having weather resistance and chemical resistance inherent to a fluoropolymer and flexibility inherent to a hydrocarbon polymer. Further, the ETFE copolymer is a material having a low refractive index, whereby reflection of light is little, and light transmittance is high.

Accordingly, the ETFE copolymer molded product is widely used as a material for e.g. an exterior film for system kitchens, a surface film of a white board for marker pens, a mold release film, an outdoor film, a member for displays or a protective film for solar batteries.

Since the ETFE copolymer is a fluoropolymer, the surface energy is low. Therefore, the contact angle to water (hereinafter referred to as water contact angle) is at least 100°. Accordingly, water droplets tend to be formed on the surface.

Therefore, in a case where an ETFE copolymer film is used as an agricultural film for e.g. a greenhouse, the film is likely to be fogged with water droplets condensed on the surface of the ETFE copolymer film, or water droplets may drop.

Further, in a case where the ETFE copolymer film is used for a member for displays or a protective film for solar batteries, and the film surface is fogged with water droplets, visibility becomes poor, or electric power generation efficiency becomes low.

As an agricultural film, which is made of a fluoropolymer having a low water contact angle and a high hydrophilic property (high antifogging property) surface, the following film has been proposed.

An agricultural film having a layer comprising a photocatalyst such as titanium oxide and silicon oxide, formed on the surface of a film made of a fluoropolymer (Patent Document 1).

However, light transmittance of such a film is low for the following reasons.

(i) The photocatalyst absorbs light.
(ii) The layer comprising titanium oxide and silicon oxide has a high refractive index, whereby the light reflection is large.

DISCLOSURE OF THE INVENTION

Problems that the Invention is to Solve

It is an object of the present invention to provide an ETFE copolymer molded product of which the surface has a high hydrophilic property and which is excellent in the light transmission property, and a method for producing the molded product.

Means to Solve the Problems

The present invention has the following constructions.
(1) A method for producing an ethylene/tetrafluoroethylene copolymer molded product comprising a substrate made of a material containing at least 50 mass % of an ethylene/tetrafluoroethylene copolymer, and a fluorine-doped silicon oxide film formed on the surface of the substrate, characterized by supplying electric power between electrodes so that the electrical power density between the electrodes becomes from 0.5 to 1.1 W/cm$^3$ to cause discharge and thus to plasmatize the following mixed gas so as to form the silicon oxide film on the substrate.

Mixed gas: comprising silicon tetrafluoride, oxygen and a hydrocarbon, wherein the atomic ratio of oxygen atoms to carbon atoms (O/C) is from 1 to 10, and the atomic ratio of oxygen atoms to silicon atoms (O/Si) is from 1.7 to 25.

(2) The method for producing an ethylene/tetrafluoroethylene copolymer molded product according to the above (1), wherein the temperature of substrate at the time of forming the silicon oxide film is at most 150° C.

(3) The method for producing an ethylene/tetrafluoroethylene copolymer molded product according to the above (1) or (2), wherein in the silicon oxide film, the atomic ratio of oxygen atoms to silicon atoms (O/Si) is from 1.6 to 2.5, and the atomic ratio of fluorine atoms to silicon atoms (F/Si) is from 0.05 to 0.50.

(4) The method for producing an ethylene/tetrafluoroethylene copolymer molded product according to any one of the above (1) to (3), wherein the water contact angle of the silicon oxide film is at most 20°.

(5) An ethylene/tetrafluoroethylene copolymer molded product comprising a substrate made of a material containing at least 50 mass % of an ethylene/tetrafluoroethylene copolymer, and a fluorine-doped silicon oxide film formed on the surface of the substrate, characterized in that in the silicon oxide film, the atomic ratio of oxygen atoms to silicon atoms (O/Si) is from 1.6 to 2.5, and the atomic ratio of fluorine atoms to silicon atoms (F/Si) is from 0.05 to 0.50, the water contact angle of the silicon oxide film is at most 20°, and an A light source luminous transmittance of the ethylene/tetrafluoroethylene copolymer molded product is from 93 to 100%.

(6) The ethylene/tetrafluoroethylene copolymer molded product according to the above (5), wherein the molar ratio of polymerized units based on tetrafluoroethylene/polymerized units based on ethylene is from 30/70 to 70/30.

EFFECTS OF THE INVENTION

The ETFE copolymer molded product of the present invention has a highly hydrophilic surface and is excellent in the light transmission property.

According to the method of the present invention for producing an ETFE copolymer molded product, it is possible to produce an ETFE copolymer molded product which has a highly hydrophilic surface and is excellent in the light transmission property.

DESCRIPTION OF SYMBOLS

10: Molded product (ETFE copolymer molded product)
12: Substrate
14: Silicon oxide film

BEST MODE FOR CARRYING OUT THE INVENTION

ETFE Copolymer Molded Product

Figure 1:
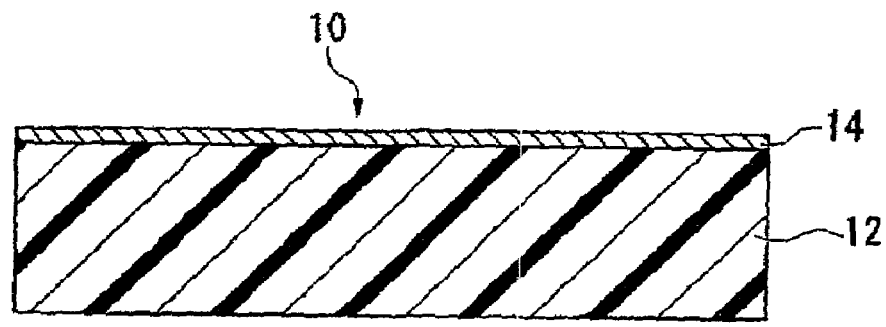
FIG. 1 is a cross-sectional view showing one example of the ETFE copolymer molded product of the present invention.

FIG. 1 is a cross-sectional view showing one example of the ETFE copolymer molded product (hereinafter referred to as molded product) of the present invention. Molded product 10 comprises a substrate 12 and a silicon oxide film 14 formed on the substrate 12.

(Substrate)

The Substrate 12 is a molded product made of a material containing at least 50 mass % of an ETFE copolymer (hereinafter referred to as ETFE material). The shape of the substrate 12 may be a film form, sheet form, tube form, pipe form or fiber form, and the film form or the sheet form is preferred. The thickness of the film or sheet is preferably from 10 to 500 μm.

The ETFE copolymer may be a copolymer of tetrafluoroethylene and ethylene (hereinafter referred to as ETFE), a terpolymer of tetrafluoroethylene, ethylene and another monomer, or a multipolymer of tetrafluoroethylene, ethylene and at least two other monomers.

The molar ratio of polymerized units based on tetrafluoroethylene (hereinafter referred to as TFE)/polymerized units based on ethylene (hereinafter referred to as E) in the ETFE copolymer (TFE/E) is preferably from 30/70 to 70/30, more preferably from 45/55 to 65/35, particularly preferably from 50/50 to 65/35. When TFE/E is within the above range, the solvent resistance, the mold release properties, the heat resistance, the mechanical strength and the molten moldability, etc. improve.

The ETFE copolymer may contain polymerized units based on other monomers.

Such other monomers may, for example, be a fluoroolefin such as vinylidene fluoride, hexafluoropropylene, $CH_2=CH(CF_2)_4F$ or $CH_2=CF(CF_2)_5F$; a perfluoro(alkyl vinyl ether) such as $CF_2=CFO(CF_2)_3F$; an olefin such as propylene or butene; a vinyl ester such as vinyl acetate or vinyl pivalate; an acrylate such as (polyfluoroalkyl)acrylate; and a methacrylate such as (polyfluoroalkyl)methacrylate. Such other monomers may be used alone or in combination as mixture of two or more of them.

Such other monomers are more preferably hexafluoropropylene, $CH_2=CH(CF_2)_4F$ and $CF_2=CFO(CF_2)_3F$, particularly preferably $CH_2=CH(CF_2)_4F$.

The content of polymerized units based on other monomers is preferably from 0.01 to 10 mol %, more preferably from 0.1 to 7 mol %, particularly preferably from 0.5 to 5 mol %, based on the total polymerized units in the ETFE copolymer (100 mol %).

The ETFE material contains at least 50 mass % of the ETFE copolymer, preferably contains at least 70 mass % of the ETFE copolymer, particularly preferably a material wherein all components other than additives are the ETFE copolymer.

The ETFE material may contain other polymers. Such other polymers may, for example, be other fluoropolymers or non-fluoropolymers.

Such other fluoropolymers may, for example, be a hexafluoropropylene-tetrafluoroethylene copolymer, a perfluoro(alkyl vinyl ether)-tetrafluoroethylene copolymer, a tetrafluoroethylene-hexafluoropropylene-vinylidene fluoride copolymer and a chlorotrifluoroethylene-ethylene copolymer.

Such other polymers may be used alone or in combination as a mixture of two or more of them.

As a case requires, the ETFE material may contain a known additive such as a pigment, an ultraviolet absorber, carbon black, carbon fiber, silicon carbide, glass fiber, mica or a crosslinking agent.

(Silicon Oxide Film)

A silicon oxide film 14 is a fluorine-doped silicon film.

Silicon, oxygen and fluorine in the silicon oxide film 14 preferably satisfy the following atomic ratio.

The atomic ratio of oxygen atoms to silicon atoms (O/Si) is from 1.6 to 2.5, and the atomic ratio of fluorine atoms to silicon atoms (F/Si) is from 0.05 to 0.50.

The silicon oxide film 14 preferably contains carbon atoms.

The atomic ratio of oxygen to silicon (O/Si) in the silicon oxide film 14 is from 1.6 to 2.5, particularly preferably from 1.9 to 2.1. Usually, in a case where a silicon oxide film is formed, O/Si becomes 2.0. When O/Si is at least 1.6, formation of dangling-bond of silicon oxide can be prevented, and deterioration of the light transmission property due to the dangling-bond can be prevented. When O/Si is at most 2.5, formation of Si—OH bond can be prevented, and deterioration of the light transmission property due to the Si—OH bond can be prevented.

The atomic ratio of fluorine atoms to silicon atoms (F/Si) in the silicon oxide film 14 is from 0.05 to 0.50, particularly preferably from 0.06 to 0.1. When F/Si is at least 0.05, transmittance of ultraviolet ray can be suppressed to be low, and it is possible to form a silicon oxide film suitable for a cover glass for solar batteries using ultraviolet ray, an agricultural film etc. When F/Si is at most 0.50, water absorption can be suppressed, and as a result, reaction of the silicon oxide film 14 with water can be suppressed, and durability of the silicon oxide film 14 can be improved.

The composition of the silicon oxide film 14 is a composition of a silicon oxide film surface (namely inside of the silicon oxide film 14) after removing a surface layer of the silicon oxide film 14 by etching.

The composition of the silicon oxide film 14 is obtained by measuring the wide spectrum of the surface of an etched silicon oxide film by using an electron spectroscopy for chemical analysis (ESCA), observing the peak intensities of C1s, O1s, F1s and Si2p orbits and calculating the atomic ratios of oxygen, fluorine and silicon. Specifically, by using a sputtering apparatus provided in the inside of an electron spectroscopy for chemical analysis (model 5500, manufactured by ULVAC-PHI, Incorporated), the surface layer of the silicon oxide film 14 is etched for from 3 to 5 nm as calculated as silica glass by the sputtering with argon, and the composition of the surface (inside of the silicon oxide film 14) of the silicon oxide film after etching is measured by using the electron spectroscopy for chemical analysis.

The water contact angle of the silicon oxide film 14 is preferably at most 20°, more preferably at most 15°, particularly preferably at most 10° (ultrahydrophilic).

The water contact angle is measured in accordance with JIS R3257 by using a commercially available contact angle tester.

The refractive index of the silicon oxide film 14 at a wavelength of 550 nm is preferably at most 1.42 which is a refractive index of ETFE, particularly preferably from 1.30 to 1.40. When the refractive index is at most 1.42, the effect to prevent reflection at the film surface can be obtained, and the light transmission property can be improved. When the refractive index is at least 1.30, it is possible to suppress deterioration of mechanical durability caused by the density of the silicon oxide film 14 becoming too low.

The refractive index can be calculated by a method of measuring the transmittance and reflectivity of the silicon oxide film 14 by using a commercially available spectrophotometer and obtaining an average refractive index by an optical simulation.

The film thickness of the silicon oxide film 14 is preferably from 40 to 120 nm, particularly preferably from 60 to 100 nm. When the film thickness is at least 40 nm, a sufficient low reflection effect can be obtained. When the film thickness is at most 120 nm, light absorption of the silicon oxide film 14 can be suppressed, and deterioration of the light transmission property can be suppressed. Further, when the film thickness is at most 120 nm, deterioration of mechanical durability of the silicon oxide film 14 can be suppressed.

In a case where a substrate 12 is a film or a sheet, the silicon oxide film 14 may be formed on one side of the substrate 12, or may be formed on both sides of the substrate 12.

(Another Layer)

Molded product 10 may contain another layer. Such another layer may, for example, be another substrate formed on the side of substrate 12, on which the silicon oxide film 14 is not formed, an adhesive layer for bonding substrates each other, a coating film which is formed by liquid phase coating by a sol-gel method or the like, or a thin film formed by a sputtering method, a vapor deposition method or the like.

The material of such another substrate may, for example, be a fluoropolymer, a non-fluoropolymer or glass.

The A light source visible transmittance of the ETFE copolymer molded product is preferably from 93 to 100%, more preferably from 94 to 100%. When the A light source visible transmittance of the ETFE copolymer molded product is at least 94%, the light transmission properties required for an agricultural film, various display members (liquid crystal display, plasma display, CRT etc.), a protective film for solar batteries, etc. can be satisfied. The A light source luminous transmittance is a luminous efficiency which is defined in JIS Z8113 and which is measured by using standard light source A defined in JIS Z8720 and calculated from a measured value in a case where a substrate is put on an optical path, where a value measured without putting a substrate is set to be 100. The A light source luminous transmittance is an index which shows brightness in a case where human see an object through a substrate.

<Method for Producing ETFE Copolymer Molded Product>

A molded product 10 is produced by a method of supplying electric power between electrodes to cause discharge and thus plasmatize a specific mixed gas, whereby a fluorine-doped silicon oxide film 14 is formed on the substrate 12.

The mixed gas contains silicon tetrafluoride, oxygen and a hydrocarbon.

The atomic ratio of oxygen atoms to carbon atoms (O/C) in the mixed gas is from 1 to 10, preferably from 2.5 to 5.0. When O/C is at least 1, the amount of oxygen is large, and carbon is not likely to remain on a silicon oxide film, whereby it is possible to suppress increase of a refractive index and deterioration of the light transmission property caused by carbon. When O/C is at most 10, a formed silicon oxide film becomes porous, and as a result a silicon oxide film 14 having a sufficient low refractive index can be formed.

The atomic ratio of oxygen atoms to silicon atoms (O/Si) in the mixed gas is from 1.7 to 25, preferably from 3 to 10. If O/Si is less than 1.7, its value is much lower than the theoretical ratio of 2.0 at which a $SiO_2$ bond can be formed, a sufficient amount of $SiO_2$ cannot be formed, and there is a problem that the utilization efficiency of materials deteriorates, and the cost for forming a film increases. Further, if O/Si exceeds 25, the reaction to form $SiO_2$ occurs in a gas phase space, fine powders are formed, and continuous operation time of the apparatus tends to be short, such being undesirable.

If the mixed gas contains a hydrocarbon, it is possible to obtain effects that: (i) a formation rate of a film is improved, (ii) the silicon oxide film 14 can be formed at a low temperature, (iii) the silicon oxide film 14 having a sufficiently low refractive index can be formed, and (iv) the mechanical durability and the chemical durability of the silicon oxide film 14 can be improved.

The mechanisms of (i) and (ii) are considered to be as follows.

In a case where the mixed gas contains no hydrocarbon, the reaction of silicon tetrafluoride and oxygen can be represented by the following formula (1):

$$SiF_4 + 5O_2 = SiO_2 + 4O_2F \quad (1)$$

In a case where the mixed gas contains a hydrocarbon (such as methane or ethane), the reaction of silicon tetrafluoride, oxygen and the hydrocarbon are represented by the following formulae (2) to (5):

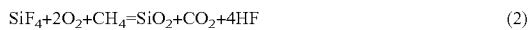
$$SiF_4 + 2O_2 + CH_4 = SiO_2 + CO_2 + 4HF \quad (2)$$

$$SiF_4 + 2O_2 + CH_4 = SiO_2 + CF_4 + 2H_2O \quad (3)$$

$$SiF_4 + 3O_2 + C_2H_4 = SiO_2 + 2CO_2 + 4HF \quad (4)$$

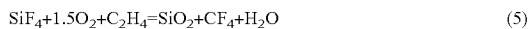
$$SiF_4 + 1.5O_2 + C_2H_4 = SiO_2 + CF_4 + H_2O \quad (5)$$

Standard free energy changes ΔG in the reactions (1) to (5) are shown below:
(1): +823 kJ/mol
(2): −726 kJ/mol
(3): −596 kJ/mol
(4): −1239 kJ/mol
(5): −443 kJ/mol The larger ΔG is, the less the reaction proceeds, and when ΔG is a positive value, the reaction is not likely to particularly proceed. ΔG in the reaction (1) is a positive value, and ΔG in the reactions (2) to (5) is a negative value. Therefore, in a case where a hydrocarbon is contained, the decomposition reaction of silicon tetrafluoride tends to proceed, and as a result the speed to form a film is improved, and the silicon oxide film 14 can be formed at a low temperature.

The reason for (iii) is considered to be as follows.

In a case where a hydrocarbon is contained in the mixed gas, a stable gas such as carbon dioxide or carbon tetrafluoride is formed as shown in the reactions (2) to (5). While forming a film, the gas taken into the silicon oxide film 14 leaks from the silicon oxide film 14, whereby many voids are formed in the silicon oxide film 14, and as a result, a refractive index of the silicon oxide film 14 becomes sufficiently low, reflection can be suppressed, and the light transmission property is improved.

The reason for (iv) is considered to be as follows.

In a case where a hydrocarbon is contained in the mixed gas, a trace amount of crosslinked carbon remains in the silicon oxide film 14, whereby the mechanical durability is improved. Further, a layer containing a large amount of carbon is formed at an extremely thin region of the surface layer of the silicon oxide film 14, whereby lubricity of the surface of the silicon oxide film 14 is improved, and as a result, friction resistance and scratch resistance are improved, while the chemical durability against water is improved.

The hydrocarbon may be a saturated hydrocarbon or an unsaturated hydrocarbon. From the viewpoint of the easiness of decomposition in plasma, the hydrocarbon is preferably a $C_{1-4}$ hydrocarbon, more preferably a $C_{1-3}$ hydrocarbon, further preferably a $C_{1-2}$ hydrocarbon such as methane, ethane or ethylene, and from the viewpoint of satisfying both the light transmission property and the mechanical durability, ethylene is particularly preferred.

The mixed gas may contain a gas having an effect to stabilize electric discharge such as nitrogen or argon. Such gas is preferably nitrogen, from the viewpoint of satisfying both the light transmission property and the mechanical durability.

The mixed gas preferably contains only silicon tetrafluoride as a gas containing silicon. Silicon tetrafluoride has characteristics: (I) since it is gas at room temperature, handling is simple, (II) since it is a relatively stable compound in plasma, fine powder is seldom formed in a chamber, and it is possible to form a film only on a substrate surface, whereby the chamber is not likely to be stained, as compared to a gas containing another silicon such as silane or alkoxysilane, and (III) since fine powder is not formed in the chamber, formation of a weak bond in the silicon oxide film 14 due to deposition of the fine powder can be prevented, whereby the silicon oxide film 14 having a sufficient mechanical durability can be formed.

The mixed gas is plasmatized by using a conventional plasma CVD apparatus.

For example, the mixed gas is plasmatized by introducing the mixed gas in a chamber of the plasma CVD apparatus and supplying electric power from a high frequency electric source between two electrodes provided in the chamber to cause electric discharge between the two electrodes.

The type of discharge may, for example, be glow discharge, corona discharge, arc discharge or non-audible discharge, and the glow electric discharge is preferred, since uniform plasma having a large area can be easily formed. The electric discharge may be continuous electric discharge which can be carried out continuously or pulse electric discharge which is carried out intermittently.

The pressure in the chamber is preferably a pressure at which glow electric discharge is generated, and it is particularly preferably from 1 to 200 Pa, since the glow electric discharge is stable.

The electric power density is from 0.5 to 1.1 $W/cm^3$, preferably from 0.8 to 1.0 $W/cm^3$. When the electric power density is within the above range, it is possible to form a silicon oxide film 14 having a water contact angle of at most 20°. Further, when the electric power density is sufficiently high, silicon tetrafluoride is sufficiently decomposed, and a silicon oxide film 14 having a sufficient film thickness can be formed. Further, in such a case, it is possible to prevent carbon from remaining in the silicon oxide film 14, and deterioration of the light transmission property of the silicon oxide film 14 can be suppressed. The electric power density is a value obtained by dividing the electric power by a volume between the electrodes.

The temperature of the substrate 12 is preferably at most 150° C. When the temperature of the substrate 12 is at most 150° C., deterioration of the mechanical durability can be suppressed. Further, deterioration of the light transmission property due to the deterioration of the substrate 12 can be suppressed.

The lower limit of the temperature of the substrate 12 is not particularly restricted, so long as the flexibility of the substrate 12 is not impaired, and it is preferably at least −20° C. When the temperature of the substrate 12 is at least −20° C., a sufficient formation rate of the film can be secured. Further, the production cost can be reduced.

The temperature of the substrate 12 can be cooled by circulating air, and it is particularly preferably from 30 to 80° C., from the viewpoint of reducing the production cost.

In the above-described method for producing the molded product 10, a mixed gas is used which contains silicon tetrafluoride, oxygen and a hydrocarbon, wherein the atomic ratio of oxygen atoms to carbon atoms (O/C) is from 1 to 10, and the atomic ratio of oxygen atoms to silicon atoms (O/Si) is from 1.7 to 25, and under the condition of the electric power density of from 0.5 to 1.1 $W/cm^3$, the mixed gas is plasmatized to form a silicon oxide film 14 on a substrate 12, whereby it is possible to produce a molded product 10, of which the surface has high hydrophilicity and which is excellent in the light transmission property.

The reason why the hydrophilicity of the silicon oxide film 14 becomes high is considered to be as follows.

When the mixed gas is plasmatized under the condition of the electric power density of from 0.5 to 1.1 $W/cm^3$, fluorine radicals are formed from the ETFE copolymer contained in the substrate 12 and contacted with plasma, and the fluorine radicals attach on a surface of the silicon oxide film 14. Since the fluorine radicals are relatively stable, they can be present on the substrate surface after the plasma treatment, and a large amount of hydroxyl groups is formed on the surface of the silicon oxide film 14 by the reaction of oxygen and moisture in air. Having the hydroxyl groups, the surface of the silicon oxide film 14 shows a hydrophilicity with a water contact angle of at most 20°.

On the other hand, in a case where the substrate is a non-fluoropolymer such as a polyethylene terephthalate (hereinafter referred to as PET), fluorine radicals are not formed from the substrate, the number of fluorine radicals which attach on the surface of the silicon oxide film 14 is small, and a hydrophilic surface cannot be formed.

The reason why the molded product 10 is excellent in the light transmission property is as follows.

As compared to a normal silicon oxide film, the fluorine-doped silicon oxide film 14 has a low refractive index. Further, many voids are formed in the silicon oxide film 14 formed by the method of the present invention, whereby an apparent refractive index of the silicon oxide film 14 is further lowered. When the apparent refractive index of the silicon oxide film 14 is lower than that of the substrate 12 (in the case of ETFE, 1.42), light reflection can be suppressed. Further, in such a case, the silicon oxide film 14 little absorbs light in the visible light region, whereby the reduction of the transmittance due to light absorption is also little.

EXAMPLES

Now, the present invention will be described in detail with reference to Examples, but it should be understood that the present invention is not limited thereto.

(Plasma CVD Apparatus)

Figure 2:
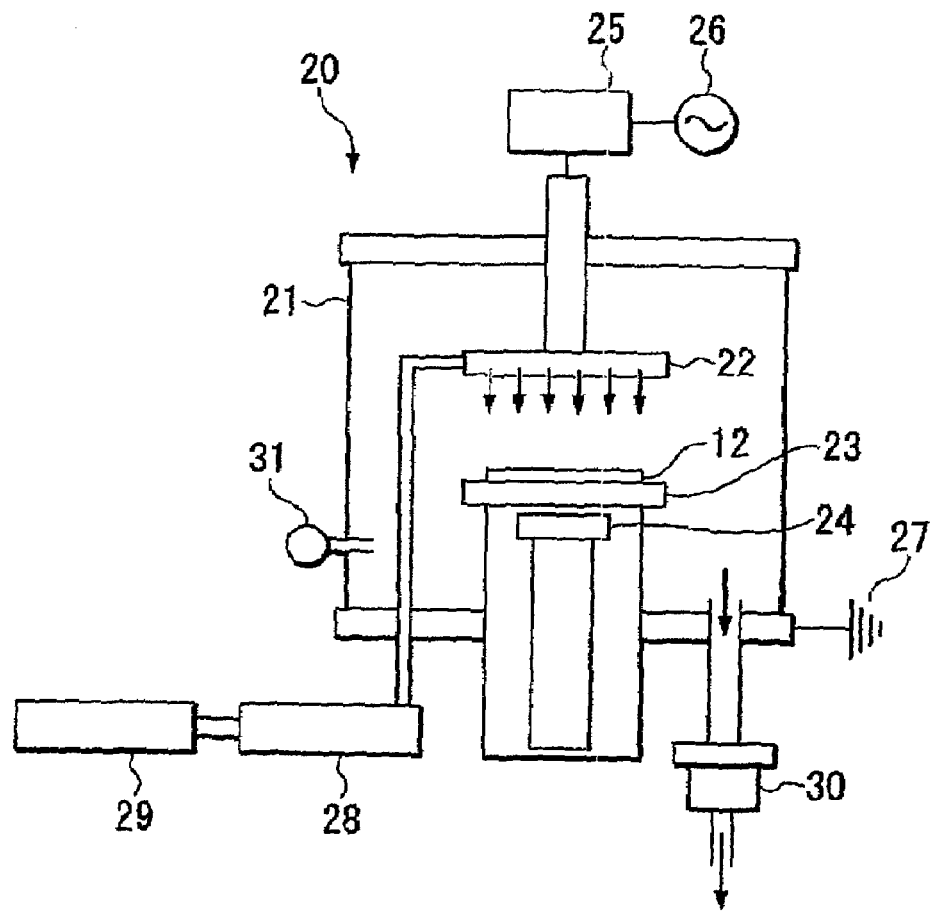
FIG. 2 is a schematic structural view showing a plasma CVD apparatus used in Examples.

FIG. 2 is schematic structural view of a plasma CVD apparatus used in Examples. The plasma CVD apparatus 20 is composed of a vacuum chamber 21, an upper shower head electrode 22 and a lower electrode 23 which are provided so as to face each other, a temperature control apparatus 24 which is provided below the lower electrode 23, a high-frequency power source 26 with 13.56 MHz which is connected to the upper shower head electrode 22 via a matching box 25, an earth 27 which contacts to the lower electrode 23, and a gas tank 29 which supplies gas to the upper shower head electrode 22 through a mass flow controller 28, in the vacuum chamber 21; a vacuum pump 30 which is provided at the bottom portion of the vacuum chamber 21 for evacuation; and a pressure gauge 31 which is provided at a side part of the vacuum chamber 21.

In Examples 1, 2, 5 and 6 and Comparative Examples 1 to 3, 5 and 6 to 8, the upper shower head electrode 22 and the lower electrode 23 are disk-shape parallel flat plate electrodes each having a diameter of 100 mm, while in Examples 3 and 4 and Comparative Example 4, they are rectangular parallel flat plate electrodes of 100 mm×170 mm, and plasma is generated by glow electric discharge between the upper shower head electrode 22 and the lower electrode 23.

The upper shower head electrode 22 serves also as a means to supply gas.

On the surface of the lower electrode 23, facing the upper shower head electrode 22 the substrate 12 can be detachably fixed.

Only one line of the mass flow controller 28 and the gas tank 29 is shown on FIG. 2. However, in a case where three types of gas are used, one line of the gas flow controller 28 and the gas tank 29 may be provided for each gas, namely the total of three lines may be provided. The gases from respective lines are mixed at the inlet of the vacuum chamber, and then the mixed gas is supplied to the upper shower head electrode 22.

The vacuum pump 30 is provided for evacuation.

(A Light Source Luminous Transmittance)

The A light source visible transmittance of the substrate after film formation was measured by means of a transmittance measuring apparatus M304 (manufactured by Asahi Spectra Co., Ltd.). Specifically by using a standard light source A defined in JIS Z8720, a visible sensitive efficiency defined in JIS Z8113 was measured. A value measured without putting the substrate was set to be 100, and a measured value in a case where the substrate was put on the optical path was calculated. The A light source visible transmittance is an index which shows brightness when human see an object through the substrate.

(Water Contact Angle)

The water contact angle of a silicon oxide film was measured by a contact-angle measuring apparatus (model CA-X150, manufactured by Kyowa Interface Science Co., Ltd.) in accordance with JIS R13257.

(Internal Composition of Silicon Oxide Film)

By using a sputtering apparatus provided in a photoelectron spectrometry (model 5500, manufactured by ULVAC PHI), from 3 to 5 nm as calculated as silica glass of the top layer of a silicon oxide film was etched by sputtering with argon, the wide spectrum of the surface of the silicon oxide film (inside of the silicon oxide film) after etching was measured by using the photoelectron spectrometry, and the molar ratios of oxygen atoms, fluorine atoms and silicon atoms were calculated by measuring the peak intensities of C1s, O1s, F1s and Si2p orbits.

Example 1

An ETFE film (product name AFLEX, manufactured by Asahi Glass Company, Limited, TFE/E=50/50, length 50 mm×width 50 mm×thickness 50 μm, water contact angle: 108°, The A light source visible transmittance: 92%) was put on the lower electrode 23, and the distance between the upper shower head electrode 22 and the lower electrode 23 was fixed to be 3 cm. Then, the vacuum chamber 21 was sealed, by using the vacuum pump 30 for evacuation, evacuation was carried out until the pressure in the vacuum chamber 21 became at most 0.1 Pa, and gas in the vacuum chamber 21 was evacuated. Then, while operating the vacuum pump, ethylene, oxygen and silicon tetrafluoride were introduced in the vacuum chamber 21 from respective gas tanks 29 through mass flow controller 28 at a flow rate shown in Table 1. The pressure in the is vacuum chamber 21 was 42 Pa. Table 1 shows O/C and O/Si in the mixed gas in the vacuum chamber 21.

Then, from the high frequency power source 25, electric power of 240 W was supplied between the upper shower head electrode 22 and the lower electrode 23 to generate glow electric discharge (continuous electric discharge), the glow electric discharge was maintained for 2 minutes to form a silicon oxide film on one surface of the ETFE film. During the glow electric discharge, the temperature of the ETFE film was 51° C. The electric power supply from the high frequency power source 26 was stopped, air was introduced in the vacuum chamber 21 so as to be atmospheric pressure, and the ETFE film (ETFE copolymer molded product) was removed.

Some measurements were carried out on the ETFE film after the film formation. Table 1 shows results.

Examples 2 to 6, Comparative Examples 1 to 4 and 6 to 8

A silicon oxide film was formed in the same manner as in Example 1 except that the condition for forming a film was changed as shown in Table 1, and respective measurements were carried out. Tables 1 to 3 show results. Further, unit (ccm) of each gas component in the Tables is a converted value of (cc)/min at 25° C. at 1 atm.

Comparative Example 5

A silicon oxide film was formed in the same manner as in Example 1, except that as a substrate 12, a PET film (50 mm×50 mm×thickness 50 μm, water contact angle: 75.6°, the A light source visible transmittance: 85.3%) was used, and the condition for forming a film was changed as shown in Table 2, and respective measurements were carried out. Table 2 shows results.

TABLE 1

| | | Ex. 1 | Ex. 2 | Ex. 3 | Ex. 4 |
|---|---|---|---|---|---|
| Substrate | | ETFE | ETFE | ETFE | ETFE |
| Condition for forming a film | | | | | |
| Hydrocarbon (ccm) | | $C_2H_4$ | $C_2H_4$ | $C_2H_4$ | $C_2H_4$ |
| | | 19 | 6 | 9 | 9 |
| $O_2$ (ccm) | | 50 | 50 | 30 | 30 |
| $SiF_4$ (ccm) | | 11 | 5 | 11 | 11 |
| $N_2$ (ccm) | | 6 | 6 | 0 | 0 |
| Mixed gas | O/C | 2.6 | 7.8 | 3.3 | 3.3 |
| (atomic ratio) | O/Si | 9.5 | 19.0 | 5.7 | 5.7 |
| Pressure (Pa) | | 42 | 40 | 48 | 48 |
| Substrate temperature (° C.) | | 51 | 45 | 29 | 26 |
| Distance between electrodes (cm) | | 3 | 3 | 3 | 5 |
| Electric power (W) | | 240 | 200 | 400 | 450 |
| Electrical density (W/cm) | | 1.0 | 0.8 | 0.8 | 0.5 |
| Treatment time (min) | | 2 | 2 | 3 | 3 |
| Film formation result | | | | | |
| A light source visible transmittance (%) | | 94 | 93.1 | 94 | 93.9 |
| Water contact angle (°) | | 5 | 15 | 5.6 | 16.2 |
| Inside film | F/Si | 0.14 | 0.22 | 0.10 | 0.09 |
| (atomic ratio) | O/Si | 2.10 | 1.9 | 1.97 | 2.05 |

TABLE 2

|  | Comp. Ex. 1 | Comp. Ex. 2 | Comp. Ex. 3 | Comp. Ex. 4 | Comp. Ex. 5 |
|---|---|---|---|---|---|
| Substrate Condition for forming a film | ETFE | ETFE | ETFE | ETFE | PET |
| Hydrocarbon (ccm) | $CH_4$ 15 | $C_2H_4$ 13 | $C_2H_4$ 6 | $C_2H_4$ 9 | $C_2H_4$ 12 |
| $O_2$ (ccm) | 8 | 16 | 26 | 30 | 50 |
| $SiF_4$ (ccm) | 0 | 0 | 9 | 11 | 21 |
| $N_2$ (ccm) | 0 | 0 | 3 | 0 | 0 |
| Mixed gas (atomic ratio) O/C | 1.1 | 1.3 | 4.1 | 3.3 | 2.6 |
| O/Si | — | — | 5.7 | 5.7 | 9.5 |
| Pressure (Pa) | 30 | 22 | 47 | 48 | 41 |
| Substrate temperature (° C.) | 50 | 42 | 46 | 18 | 48 |
| Distance between electrodes (cm) | 2 | 3 | 1 | 4 | 3 |
| Electric power (W) | 125 | 175 | 200 | 300 | 230 |
| Electrical density (W/cm) | 0.8 | 0.7 | 1.2 | 0.4 | 0.8 |
| Treatment time (min) | 2 | 2 | 3 | 3 | 4 |
| Film formation result |  |  |  |  |  |
| A light source visible transmittance (%) | 90.9 | 87.9 | 93 | 92.6 | 89.7 |
| Water contact angle (°) | 5.3 | 3.9 | 33.5 | 62.7 | 60.8 |
| Inside film (atomic ratio) F/Si | — | — | 0.03 | 1.1 | 0.102 |
| O/Si | — | — | 1.98 | 3.1 | 2.01 |

TABLE 3

|  | Ex. 5 | Ex. 6 | Comp. Ex. 6 | Comp. Ex. 7 | Comp. Ex. 8 |
|---|---|---|---|---|---|
| Substrate Condition for forming a film | ETFE | ETFE | ETFE | ETFE | ETFE |
| Hydrocarbon (ccm) | $C_2H_4$ 19 | $C_2H_4$ 19 | $C_2H_4$ 7 | $C_2H_4$ 9 | $C_2H_4$ 8 |
| $O_2$ (ccm) | 50 | 50 | 6 | 150 | 70 |
| $SiF_4$ (ccm) | 11 | 11 | 5 | 18 | 14 |
| $N_2$ (ccm) | 0 | 6 | 0 | 0 | 0 |
| Mixed gas (atomic ratio) O/C | 2.6 | 2.6 | 0.9 | 16.7 | 8.3 |
| O/Si | 9.5 | 9.5 | 2.4 | 17.1 | 28.6 |
| Pressure (Pa) | 42 | 42 | 20 | 70 | 48 |
| Substrate temperature (° C.) | 150 | 48 | 40 | 50.9 | 37.5 |
| Distance between electrodes (cm) | 3 | 3 | 3 | 3 | 3 |
| Electric power (W) | 240 | 200 | 200 | 240 | 240 |
| Electrical density (W/cm) | 1 | 0.8 | 0.83 | 1 | 1 |
| Treatment time (min) | 2 | 2 | 1 | 1 | 2 |
| Film formation result |  |  |  |  |  |
| A light source visible transmittance (%) | 93 | 93.7 | 89 | 92.2 | 91.8 |
| Water contact angle (°) | 11.9 | 6 | 49.5 | 35.9 | 28.4 |
| Inside film (atomic ratio) F/Si | 0.11 | 0.31 | — | — | — |
| O/Si | 2 | 1.81 | — | — | — |

In Examples 1 to 6, the transmittance of the ETFE film after film formation was higher than that of the ETFE film before film formation. Further, the water contact angle of the surface of the silicon oxide film was at most 20°, and the silicon oxide film thereby had hydrophilicity.

In Comparative Examples 1 and 2, since the mixed gas containing no silicon tetrafluoride was used, the transmittance of the ETFE film after the film formation was lower than that of the ETFE film before the film formation.

In Comparative Examples 3 and 4, the electric density was out of the range of from 0.5 to 1.1 W/cm³, the water contact angle of the surface of the silicon oxide film on the ETFE film after the film formation could not become sufficiently low.

In Comparative Example 5, since a substrate of a PET film after the film formation was a PET film, the water contact angle of the surface of the silicon oxide film could not become sufficiently low.

In Comparative Example 6, Since the atomic ratio of oxygen atoms to carbon atoms (O/C) was out of the range of from 1 to 10, the transmittance of the ETFE film after the film formation was low, and the water contact angle of the surface of the silicon oxide film could not be sufficiently low.

In Comparative Example 7, since the atomic ratio of oxygen atoms to carbon atoms (O/C) was out of the range of 1 to 10, the water contact angle of the silicon oxide film on the ETFE film after the film formation could not be sufficiently low.

In Comparative Example 8, the atomic ratio of oxygen atoms to silicon atoms (O/Si) was the out of the range of 1.7 to 25, transmittance of the ETFE film after the film formation was low, and the water contact angle of the surface of the silicon oxide film could not be sufficiently low.

INDUSTRIAL APPLICABILITY

The ETFE copolymer molded product produced by the production method of the present invention has a high hydrophilicity and is excellent light transmission properties, whereby it is useful as an agricultural film, various display members (liquid crystal display, plasma display, CRT, etc.), a protective film for solar batteries, etc.

The entire disclosure of Japanese Patent Application No. 2006-298824 filed on Nov. 2, 2006 including specification, claims, drawings and summary is incorporated herein by reference in its entirety.

What is claimed is:

1. A method for depositing a fluorine-doped silicon oxide film on the surface of a substrate made of a material comprising at least 50 mass % of an ethylene/tetrafluoroethylene copolymer, the method comprising flowing a mixed gas into between electrodes, exposing the mixed gas to electric power applied between the electrodes so that the electrical power density between the electrodes becomes from 0.5 to 1.1 W/cm³ to cause discharge, forming plasma of the mixed gas and depositing the fluorine-doped silicon oxide film on the surface of the substrate,
    wherein the mixed gas for forming the fluorine-doped silicon oxide film comprises silicon tetrafluoride, oxygen and a hydrocarbon, and
    wherein the atomic ratio of oxygen atoms to carbon atoms (O/C) is from 1 to 10, and the atomic ratio of oxygen atoms to silicon atoms (O/Si) is from 1.7 to 25 in the mixed gas.

2. The method according to claim 1, wherein a temperature of the substrate at the time of forming the fluorine-doped silicon oxide film is at most 150° C.

3. The method according to claim 1, wherein in the fluorine-doped silicon oxide film, the atomic ratio of oxygen atoms to silicon atoms (O/Si) is from 1.6 to 2.5, and the atomic ratio of fluorine atoms to silicon atoms (F/Si) is from 0.05 to 0.50.

4. The method according to claim 1, wherein the contact angle of the fluorine-doped silicon oxide film to water is at most 20°.

5. The method according to claim 1, wherein a thickness of the substrate is from 10 to 500 µM.

6. The method according to claim 1, wherein a molar ratio of tetrafluoroethylene units to ethylene units in the ethylene/tetrafluoroethylene copolymer is from 30/70 to 70/30.

7. The method according to claim 1, wherein the material further comprises from 0.01 to 10 mol. % of additional polymerizable units based on the total content of units.

8. The method according to claim 1, wherein the atomic ratio of oxygen atoms to silicon atoms (O/Si) in the mixed gas is from 3 to 10.

9. The method according to claim 1, wherein the atomic ratio of oxygen to silicon (O/Si) in the fluoride-doped silicon oxide film is from 1.9 to 2.1.

10. The method according to claim 1, wherein the atomic ratio of fluorine atoms to silicon atoms (F/Si) is from 0.06 to 0.1.

11. The method according to claim 1, wherein the contact angle of the fluorine-doped silicon oxide film to water is at most 15°.

12. The method according to claim 1, wherein the refractive index of the fluorine-doped silicon oxide film at a wavelength of 550 nm is at most 1.42.

13. The method according to claim 1, wherein a thickness of the fluorine-doped silicon oxide film is from 40 to 120 nm.

14. The method according to claim 1, wherein the electrical power density between the electrodes becomes from 0.8 to 1.0 W/cm$^3$.

* * * * *